US008525393B1

(12) United States Patent
Grbovic et al.

(10) Patent No.: US 8,525,393 B1
(45) Date of Patent: Sep. 3, 2013

(54) BIMATERIAL MICROELECTROMECHANICAL SYSTEM (MEMS) SOLAR POWER GENERATOR

(75) Inventors: Dragoslav Grbovic, Mountain View, CA (US); Sebastian Osswald, Monterey, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 132 days.

(21) Appl. No.: 13/349,444

(22) Filed: Jan. 12, 2012

Related U.S. Application Data

(60) Provisional application No. 61/342,101, filed on Jan. 12, 2011.

(51) Int. Cl.
*H01L 41/08* (2006.01)

(52) U.S. Cl.
USPC .......................................... 310/339; 310/311

(58) Field of Classification Search
USPC ................................................... 310/311, 339
See application file for complete search history.

(56) References Cited

U.S. PATENT DOCUMENTS

| | | | | |
|---|---|---|---|---|
| 4,524,294 | A * | 6/1985 | Brody | 310/311 |
| 6,118,124 | A * | 9/2000 | Thundat et al. | 250/332 |
| 2007/0040469 | A1 * | 2/2007 | Yacoubian | 310/311 |
| 2008/0182207 | A1 * | 7/2008 | Yamazaki et al. | 430/311 |

* cited by examiner

*Primary Examiner* — Mark Budd
(74) *Attorney, Agent, or Firm* — Lisa A. Norris

(57) ABSTRACT

A bimaterial microelectromechanical system (MEMS) solar power generator device converts radiant energy received from the sun, or other light source, into heat, which is then used to produce electricity through the piezoelectric effect. As the efficiency of piezoelectric materials can often reach up to 90%, the efficiency is greater than that of conventional solar cells.

18 Claims, 14 Drawing Sheets

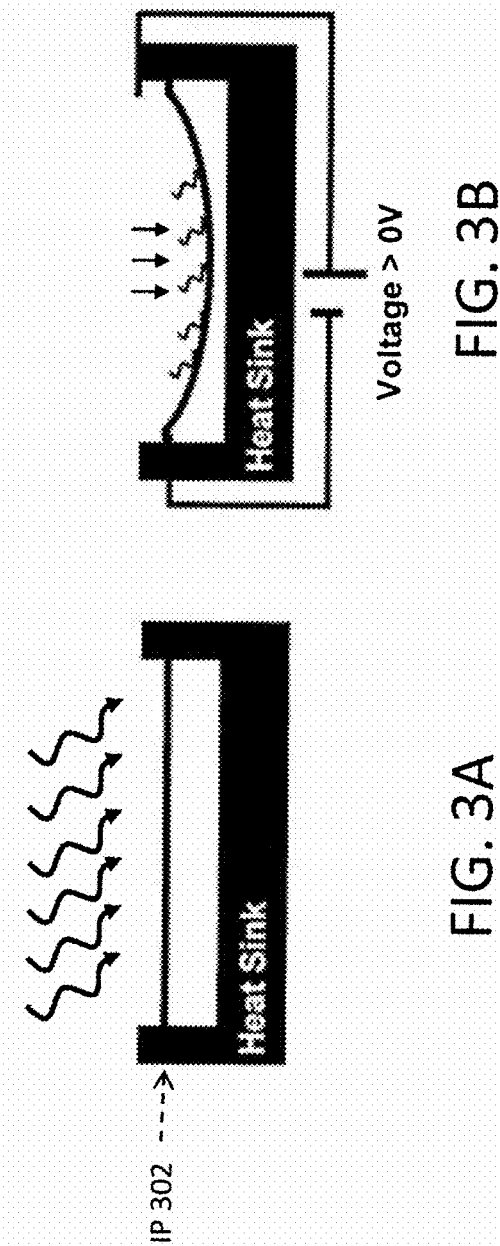

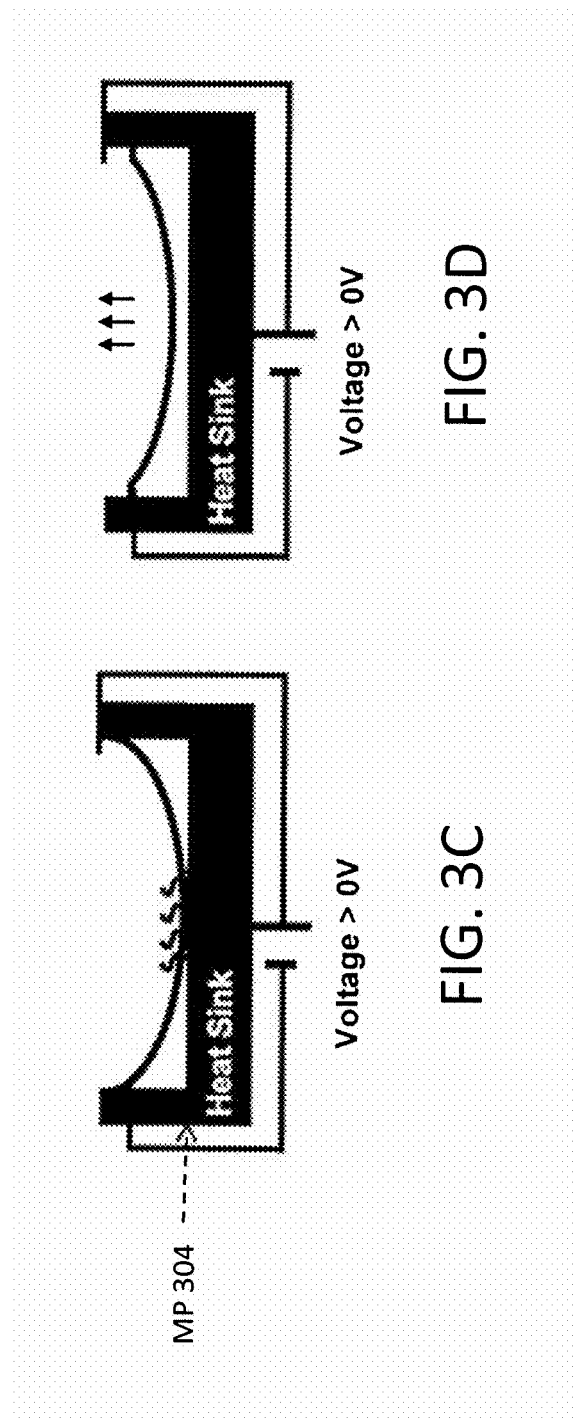

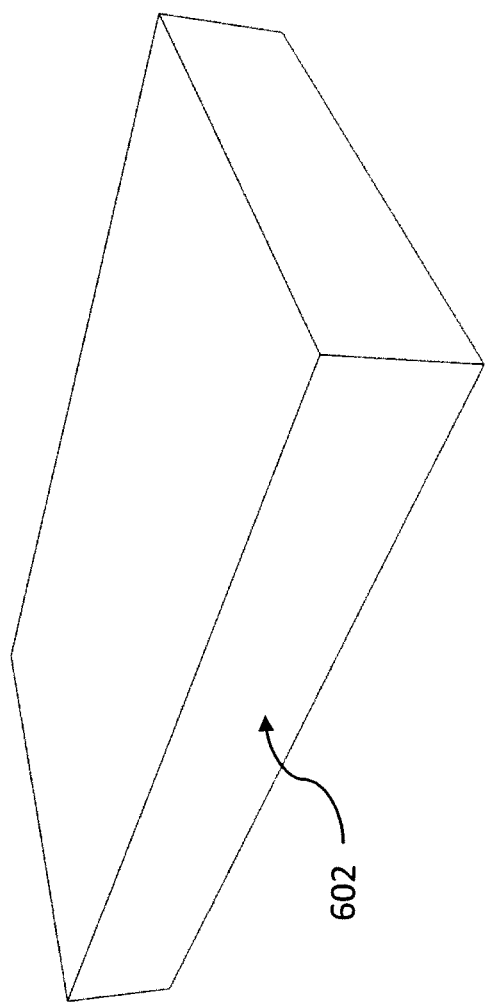

BIMATERIAL MICROELECTROMECHANICAL SYSTEM (MEMS) SOLAR POWER GENERATOR

CROSS-REFERENCE TO RELATED APPLICATIONS

This application claims the benefit of U.S. Provisional Application No. 61/432,101, filed Jan. 12, 2011, which is hereby incorporated in its entirety by reference.

BACKGROUND OF THE INVENTION

1. Field of the Invention

The present invention relates generally to microelectromechanical systems (MEMS) and solar power generators.

2. Description of the Related Art

Harvesting energy from the sun offers clean solutions to growing energy challenges and can help decrease dependence on fossil fuels. Solar power is also a promising candidate for powering autonomous systems, such as sensors and actuators in remote areas. However, in order to meet the demanding energy needs of modern devices, high solar conversion efficiencies are needed.

Prior art solar cell technologies suffered from low efficiencies and were spectrum-dependent as the photoactive semiconductor materials dictated the energies required to create an electron-hole pair and therefore transform solar energy into electric energy. Some prior art multi-junction solar cells employed a variety of layered materials in order to broaden the range of photoactive wavelengths. However, this significantly complicated the manufacturing process and the devices became economically unfeasible for commercial applications.

SUMMARY OF THE INVENTION

In accordance with one embodiment, a bimaterial microelectromechanical system (MEMS) solar power generator device converts radiant energy received from the sun, or another light source, into heat, which is used to produce a deformation, which in turn produces electricity through the piezoelectric effect. As the efficiency of piezoelectric materials can often reach up to 90%, the efficiency of some embodiments in accordance with the invention can be greater than that of conventional solar cells. In some embodiments, the bimaterial MEMS solar power generator device is spectrum-insensitive and converts a large fraction of incident solar radiation into electricity.

Bimaterial MEMS solar power generators in accordance with the invention are highly efficient and adaptable for powering small sensors as well as for powering large arrays allowing for the replacement of costly, less-efficient solar cells.

Embodiments in accordance with the invention are best understood by reference to the following detailed description when read in conjunction with the accompanying drawings.

BRIEF DESCRIPTION OF THE DRAWINGS

FIGS. 3A-3D illustrate the conversion of solar radiation into electrical energy using the bimaterial MEMS solar power generator device of FIG. 1 in accordance with one embodiment.

FIGS. 6A-6G illustrate a method for forming the bimaterial MEMS solar power generator device of FIG. 1.

Embodiments in accordance with the invention are further described herein with reference to the drawings.

DETAILED DESCRIPTION OF THE INVENTION

Figure 1:
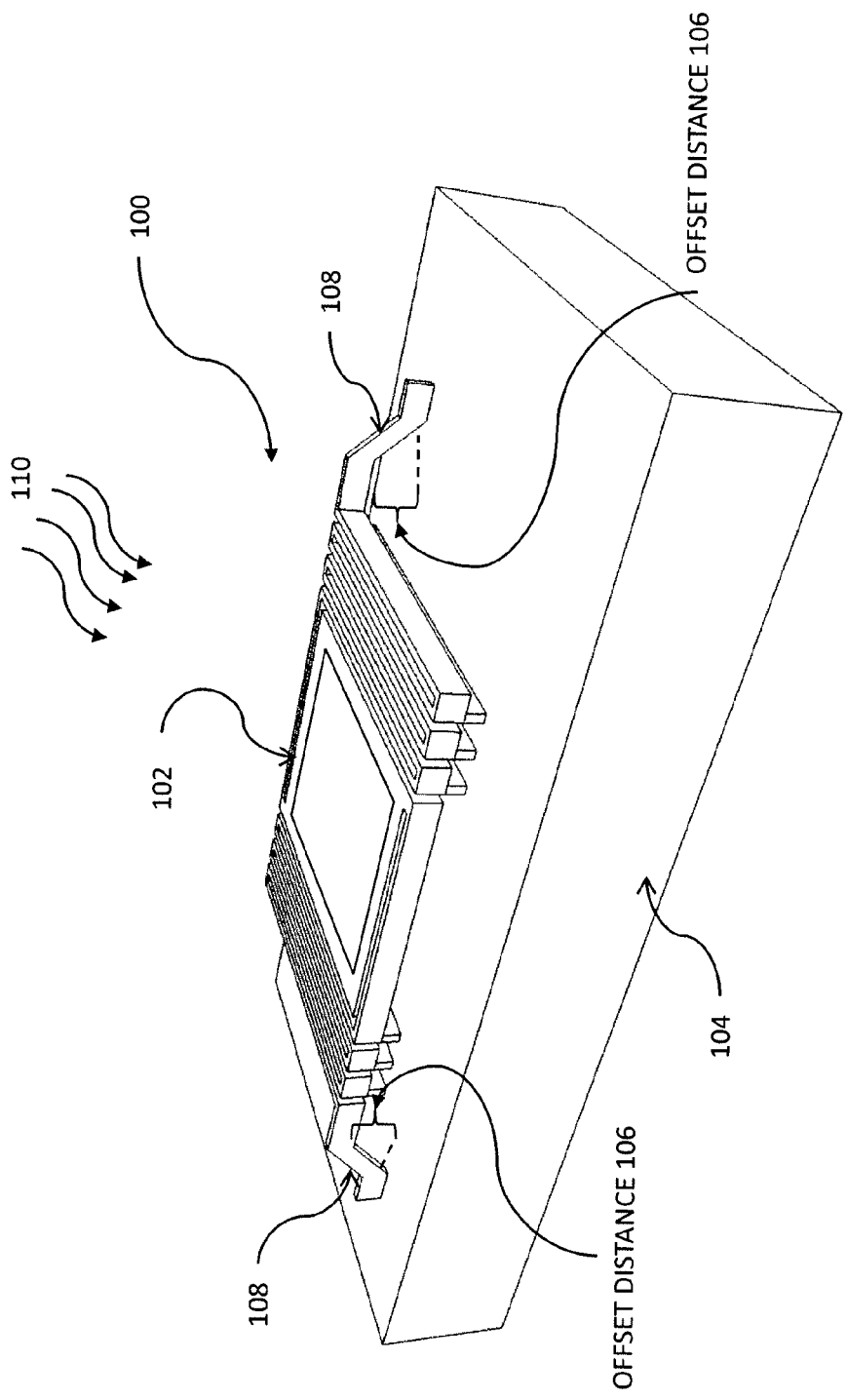
FIG. 1 illustrates a bimaterial MEMS solar power generator device in accordance with one embodiment.

FIG. 1 illustrates a bimaterial MEMS solar power generator device 100 in accordance with one embodiment. Herein a solar power generator is defined as a device that produces electricity when powered by radiation from the sun or other radiant source. As shown in FIG. 1, in one embodiment, bimaterial MEMS solar power generator device 100 includes a bimaterial piezoelectric structure 102 in contact with a heat sink structure 104, such as a silicon (Si) substrate. In one embodiment, support legs 108 of bimaterial piezoelectric structure 102 support it above heat sink structure 104 at an offset distance 106. When exposed to radiative energy, such as sunlight (shown as waves 110), bimaterial MEMS solar power generator device 100 converts radiative energy into heat, which is then used to produce deformation through the bimorph effect and then electricity through the piezoelectric effect as further described herein. Although not shown, in operation, electrical circuit connections can be placed in contact with bimaterial piezoelectric structure 102, such as at support legs 108 in this embodiment, to allow the electricity produced by bimaterial MEMS solar power generator device 100 to be transferred from device 100 and utilized, such as by a load (not shown).

Figure 2:
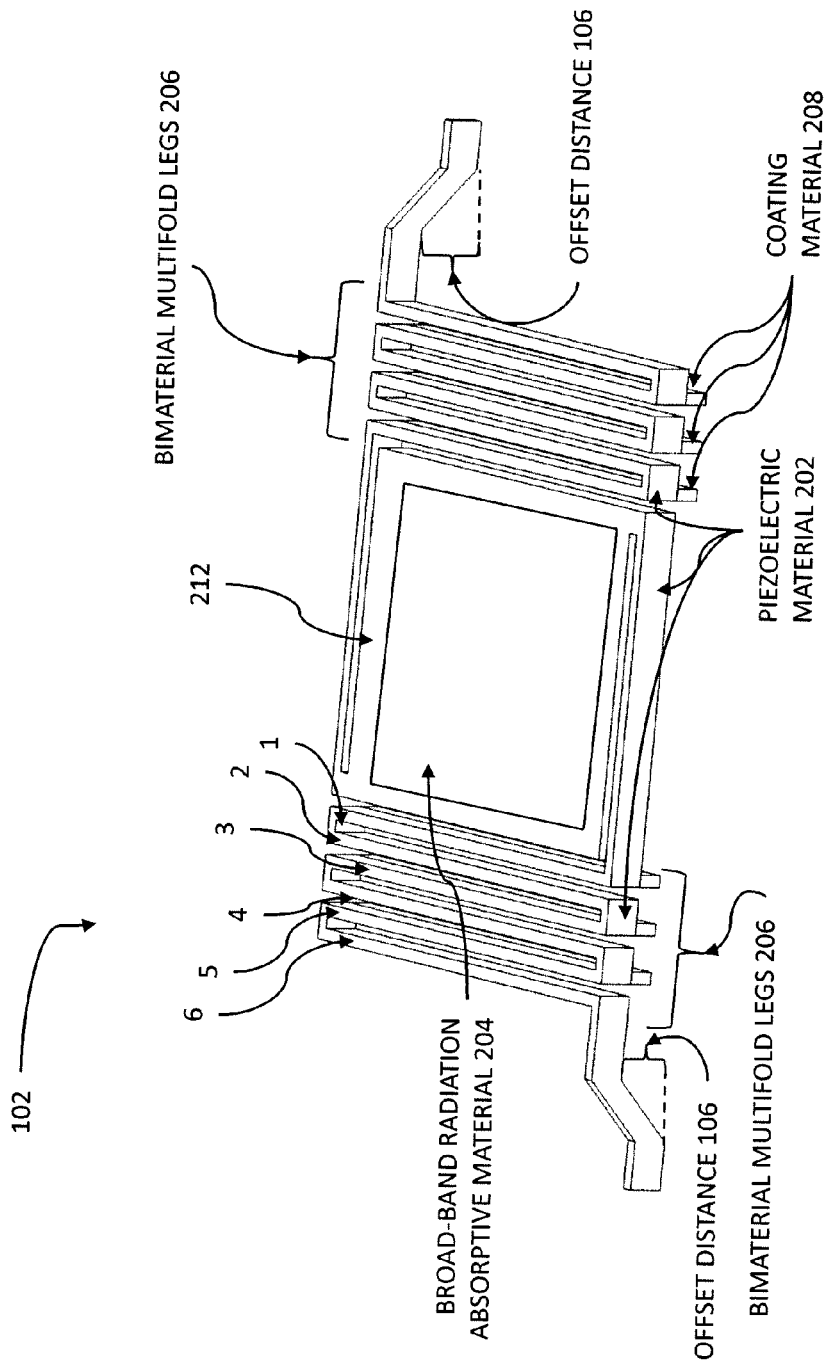
FIG. 2 illustrates the bimaterial piezoelectric structure of FIG. 1 in accordance with one embodiment.

FIG. 2 illustrates bimaterial piezoelectric structure 102 in accordance with one embodiment. As shown in FIG. 2, in one embodiment, bimaterial piezoelectric structure 102 includes a piezoelectric material 202, a broad-band radiation absorptive material 204, and a coating material 208. In one embodiment, piezoelectric material 202 is formed of quartz, aluminum nitride (AlN), silicon carbide (SiC), or other material having piezoelectric properties. In one embodiment, coating material 208 is formed of material having a different thermal expansion coefficient from piezoelectric material 202. In one embodiment coating material 208 is formed of a metal, such as aluminum (Al), however, other materials having a different thermal expansion coefficient from piezoelectric material 202 can also be used.

In one embodiment, broad-band radiation absorptive material 204 is formed of a carbon nanomaterial or other material having high broad-band radiation absorption properties for at least a portion of the wavelengths of energy emitted by the sun or other light source. In one embodiment, broad-band radiation absorptive material 204 is a photoactive material capable of absorbing wavelengths of light energy in the range of microwave to UV and converting them to heat. For further details on broad-band radiation highly absorptive materials, see, for example, "Super black and ultrathin amorphous carbon film inspired by anti-reflection architecture in butterfly wing", by Q. Zhao, et al., Carbon, Vol. 49, Issue 3, pg. 877.

In one embodiment, broad-band radiation absorptive material 204 is formed on a top surface of piezoelectric material 202 and is in conductive contact with piezoelectric material 202. This allows broad-band radiation absorptive material 204 to absorb radiative energy, such as from the sun, and transfer the radiative energy as thermal energy to piezoelectric material 202. In some embodiments, broad-band radiation absorptive material 204 is formed on a central body portion 212 of structure 102 in a pad configuration as shown in FIG. 2. In other embodiments, broad-band radiation absorptive material 204 is formed across the entire top surface of structure 102, or to selected portions of structure 102.

In one embodiment, piezoelectric material 202 and coating material 208 have different thermal expansion coefficients. In accordance with embodiments further described herein, the differing coefficients of thermal expansion of coating material 208 and piezoelectric material 202 allow portions of bimaterial piezoelectric structure 102 to deform, creating electric energy through piezoelectric and bimorph effects.

In one embodiment, bimaterial piezoelectric structure 102 includes bimaterial multifold legs 206. As shown in FIG. 2, in one embodiment, structure 102 includes two sets of bimaterial multifold legs 206, each set having 6 legs (numbered in FIG. 2 as 1, 2, 3, 4, 5, and 6). In other embodiments, different numbers of sets of bimaterial multifold legs 206 can be utilized, and the number and or shape of each bimaterial multifold leg 206 can differ from the embodiment shown in FIG. 2. It can be appreciated that in different embodiments, the electrical output of device 100 may vary dependent upon the selected configuration.

In one embodiment, coating material 208 is located on alternating legs of bimaterial multifold legs 206. Thus, in some embodiments, the formed bimaterial of coating material 208 on piezoelectric material 202 may be on selected portions of bimaterial multifold legs 206. Thus for example in FIG. 2, coating material 208 is present on legs 1, 3 and 5 of bimaterial multifold leg 206, and similarly, though not numbered, on the opposite bimaterial multifold leg 206 structure as well. This configuration causes the coated, bimaterial legs (1, 3 and 5) to bend upward toward the incident flux, and central body portion 212 of structure 102 displaces about uniformly downward toward heat sink structure 104. This reversal of displacement is due to the deflection angle of the final piezoelectric leg, e.g., leg 6. In one example test, utilizing a heat flux of 700 W/m$^2$ to simulate the solar flux on the surface of the earth with an ambient temperature of 293.15, the displacement of central body portion 212 is approximately 5 um.

As earlier described, in one embodiment, coating material 208 has a different thermal expansion coefficient from piezoelectric material 202. In one embodiment, coating material 208 has a coefficient of thermal expansion in the range of about $10 \times 10^{-6}$/K to about $30 \times 10^{-6}$/K. In one embodiment, the larger the differences of thermal expansion coefficients between piezoelectric material 202 and coating material 208, the more deformation is calculated. For further details on deformation calculations, see for example, Grbovic, D., Imaging by detection of infrared photons using arrays of uncooled micromechanical detectors, PhD diss., University of Tennessee, 2008 (http://trace.tennessee.edu/utk/graddiss/404).

As earlier described, in one embodiment, bimaterial piezoelectric structure 102 is located above heat sink structure 104 (FIG. 1) at offset distance 106. Offset distance 106 is defined herein as the distance between the bottom surface of central body portion 212, and the top surface of heat sink structure 104 (FIG. 1). In one embodiment, offset distance 106 is about 80 to 90% of the maximum displacement of central body portion 212 obtained for a given dimension with moderate incoming heat flux, for example 300 W/m$^2$. This allows central body portion 212 to touch heat sink structure 104 (FIG. 1) when thermally deformed and still allow the motion necessary to generate a voltage in bimaterial piezoelectric structure 102.

FIGS. 3A-3D illustrate the conversion of solar radiation into electrical energy using bimaterial MEMS solar power generator device 100 of FIG. 1 in accordance with one embodiment. Referring now to FIGS. 1, 2 and 3A, in one embodiment, bimaterial piezoelectric structure 102 initially begins at an initial position (IP), when not exposed to radiant energy, shown as IP 302 in FIG. 3A. When exposed to radiant energy, such as sunlight, broad-band radiation absorptive material 204, for example, carbon nanoparticles, absorbs a large fraction of radiant energy, e.g., solar radiation (shown as waves in FIG. 2), and converts the radiant energy into heat.

Referring now to FIGS. 1, 2, and 3B, as a consequence, the temperature of piezoelectric material 202, and coating material 208 increases. The temperature increase induces a thermal expansion of piezoelectric material 202, and coating material 208. Due to a mismatch in the thermal expansion coefficients, both piezoelectric material 202 and coating material 208 expand at different rates causing bimaterial piezoelectric structure 102 to deform, e.g., bend. This mechanical deformation turns some of the heat energy into mechanical energy. The deformation generates a potential difference at ends of bimaterial MEMS solar power generator device 100 due to the piezoelectric effect turning some of the mechanical energy into electrical energy. More particularly, bimaterial multifold legs 206 begin to deform due to the mismatch in the thermal expansion coefficients between piezoelectric material 202 and coating material 208. This generates electricity, e.g., voltage (V) greater than zero (V>0V).

Referring now to FIGS. 1, 2, and 3C, in one embodiment, when bimaterial piezoelectric structure 102 reaches a maximum displacement position (MP), shown as MP 304, central body portion 212 of bimaterial piezoelectric structure 102 contacts heat sink structure 104 (FIG. 1). Heat is then transferred from bimaterial piezoelectric structure 102 to heat sink 104.

Referring now to FIGS. 1, 2, and 3D, removal of heat from bimaterial piezoelectric structure 102 causes structure 102 to cool and relax to a state closer to IP 304 (FIG. 3A), e.g., un-deform. This process is repeated, with solar radiation heating bimaterial MEMS solar power generator device 100 again. This continued oscillation of bimaterial MEMS solar power generator device 100 generates electrical energy in bimaterial piezoelectric structure 102 which can then be drawn off through electrical connections and utilized.

In the present embodiment, a deformation-magnification technique is utilized in bimaterial MEMS solar power generator device 100 to increase the total deformation. In one embodiment, bimaterial multifold legs 206 are utilized and combine individual deformations into a large displacement, thus increasing the total amount of electricity that can be produced by device 100.

Figure 4:
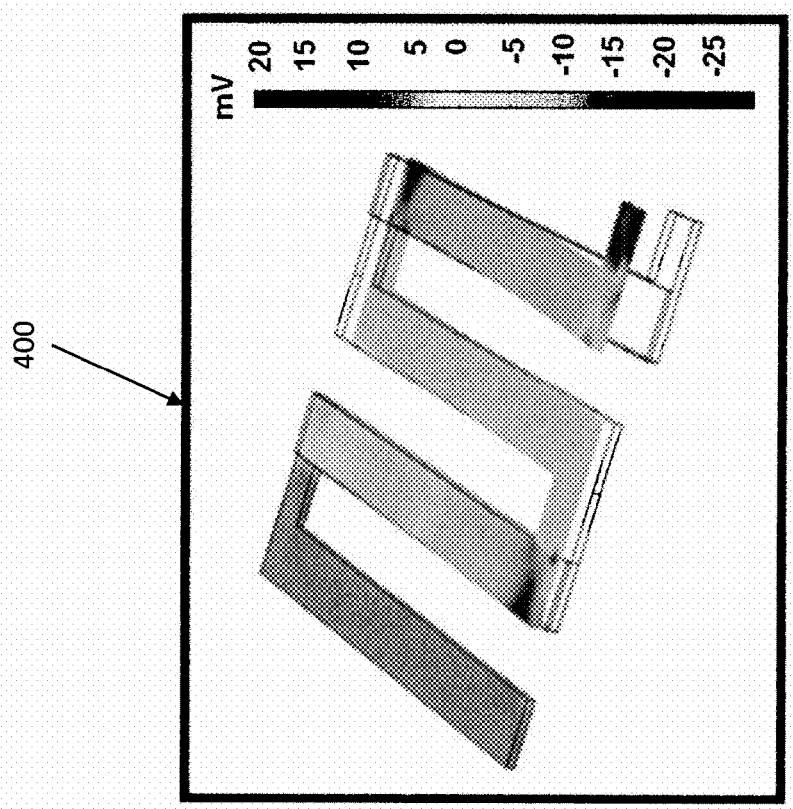
FIG. 4 illustrates an example voltage profile of one of the bimaterial multifold legs sets of FIG. 1 in accordance with one embodiment.

FIG. 4 illustrates an example voltage profile 400 of one of bimaterial multifold legs 206 of device 100 in accordance with one embodiment. In one embodiment, voltage profile 400 results from deformation, e.g., bending, induced by the mismatch in thermal expansion coefficients of piezoelectric material 202 and coating material 208 when exposed to radiative energy, e.g., sunlight. In one embodiment, an exemplar bimaterial MEMS solar power generator device 100 is sized at about 200 μm×200 μm and exhibits an output voltage of −80 mV. The testing results indicate a potential difference of −40 mV per bimaterial multifold leg 206, meaning about 80 mV per structure of about 200 μm×200 μm in size.

Figure 5:
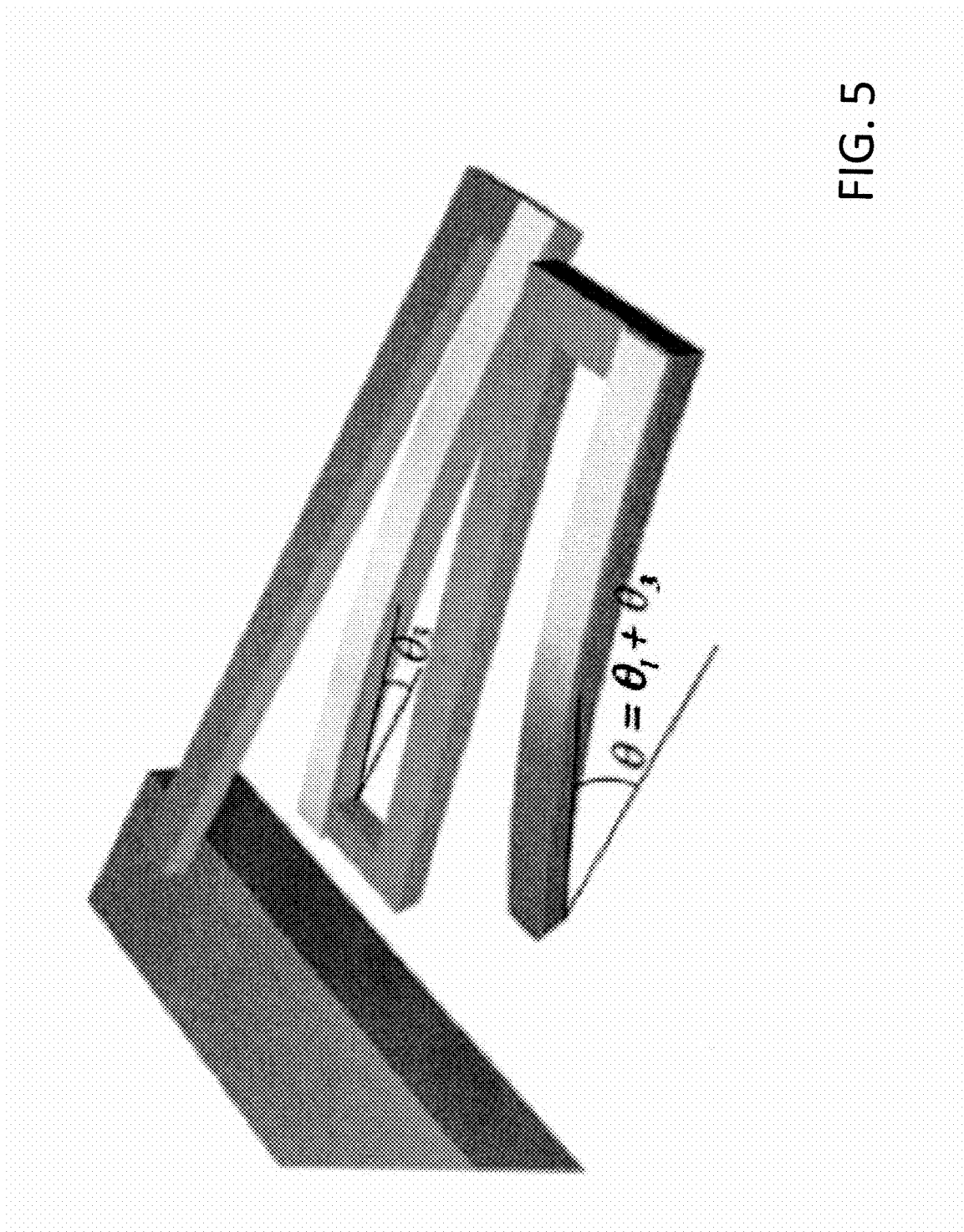
FIG. 5 illustrates the deformation of bimaterial multifold legs, due to temperature increase, in accordance with one embodiment.

FIG. 5 illustrates the deformation of bimaterial multifold legs 206, due to temperature increase, in accordance with one embodiment.

FIGS. 6A-6G illustrate a method for forming bimaterial MEMS solar power generator device 100 in accordance with one embodiment shown in FIG. 1. FIG. 7 illustrates a process flow diagram of a method 700 for forming bimaterial MEMS solar power generator device 100 in accordance with one embodiment. Individual general MEMS fabrication processes and terms used herein are well known to those of skill in the art.

Referring now to FIGS. 6A and 7, in operation 702, a substrate 602, such as a silicon wafer, is obtained and utilized on which to grow, i.e., fabricate, bimaterial MEMS solar power generator device 100.

Figure 6B:
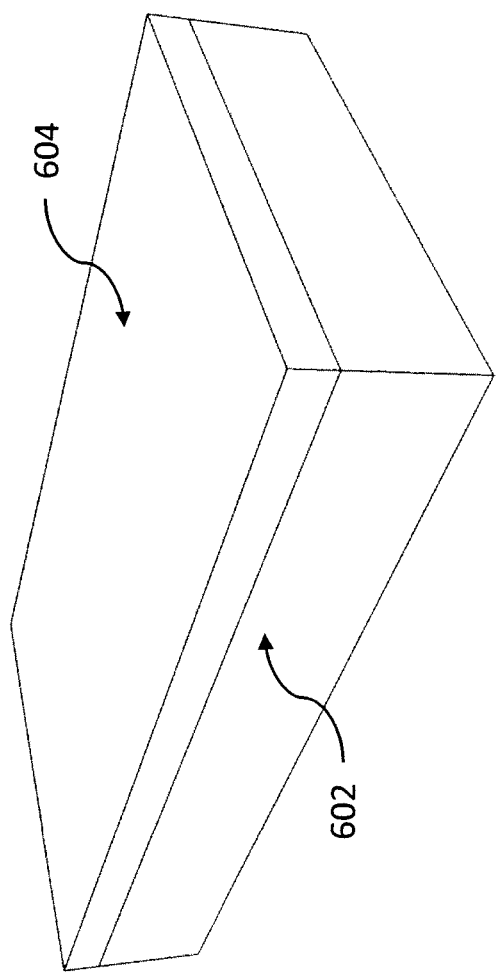
Figure 7:
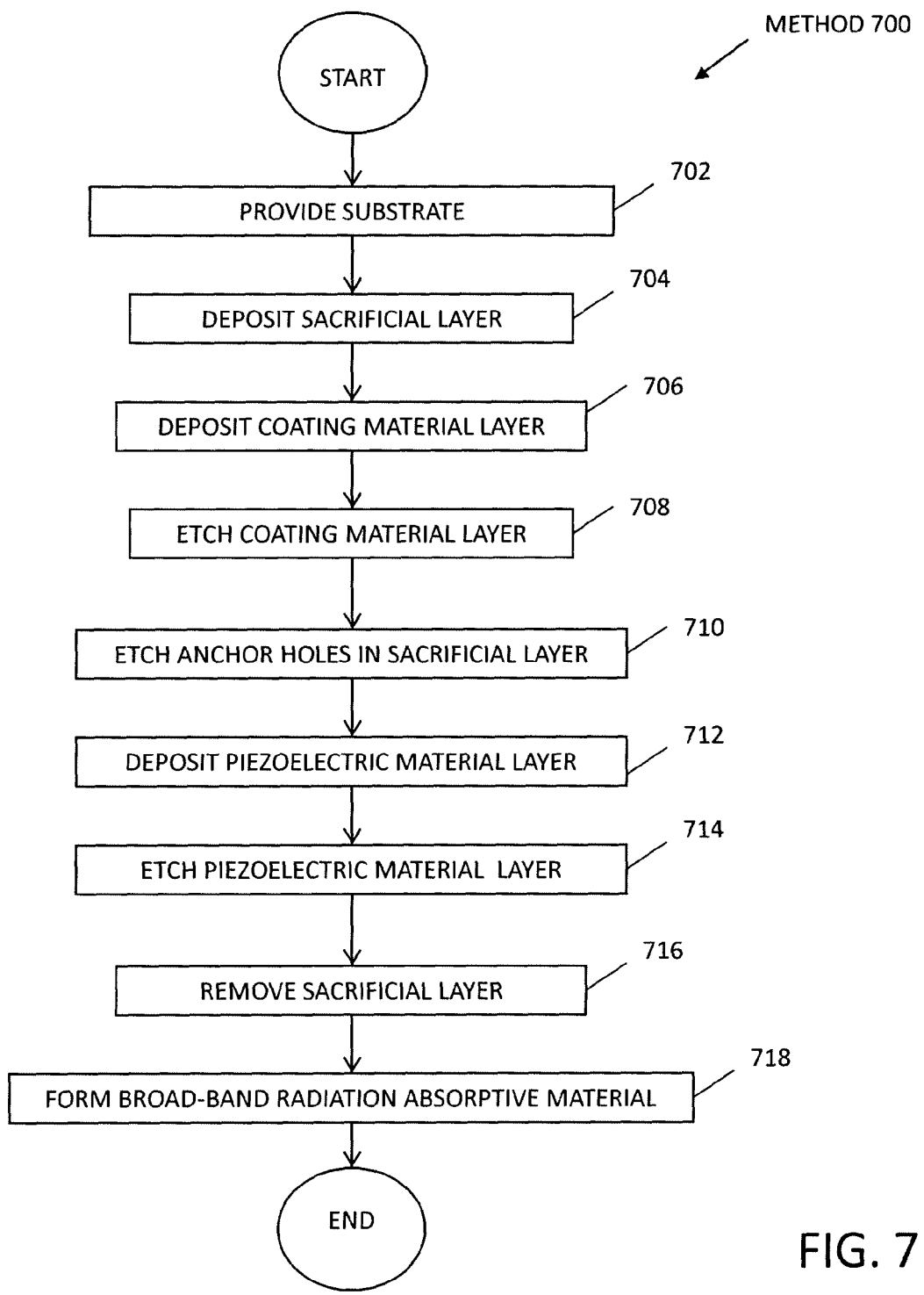
FIG. 7 illustrates a process flow diagram of a method for forming the bimaterial MEMS solar power generator device of FIG. 1.

Referring now to FIGS. 6B and 7, in operation 704, due to the bimaterial of piezoelectric material 202 (FIG. 2) and coating material 208 (FIG. 2) being on the bottom of device 100, a sacrificial layer 604 is deposited on a top surface of substrate 602 as illustrated in FIG. 6B. In one embodiment, sacrificial layer 604 is formed to have a thickness of the desired offset distance (offset distance 106, FIG. 1).

Figure 6C:
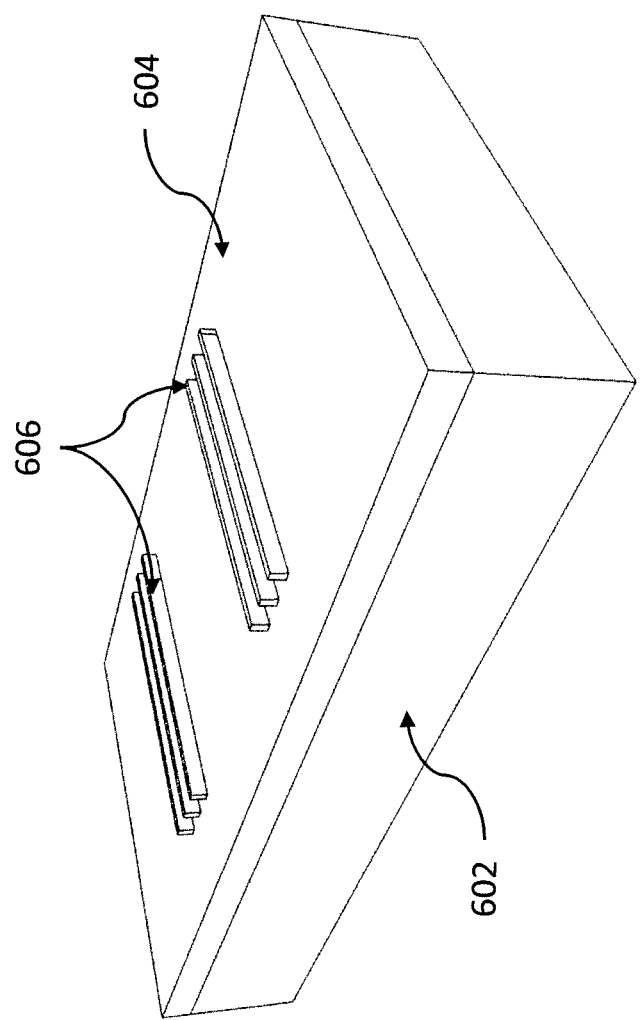

Referring now to FIGS. 6C and 7, in operation 706, following deposition of sacrificial layer 604, a coating material layer (not shown), for example, aluminum (Al), is deposited over a top surface of sacrificial layer 604 and in operation 708, the coating material layer is etched to create alternating coating material 208 portions (FIG. 2), shown as 606 in FIG. 6C, of bimaterial multifold legs 206 (FIG. 2).

Figure 6D:
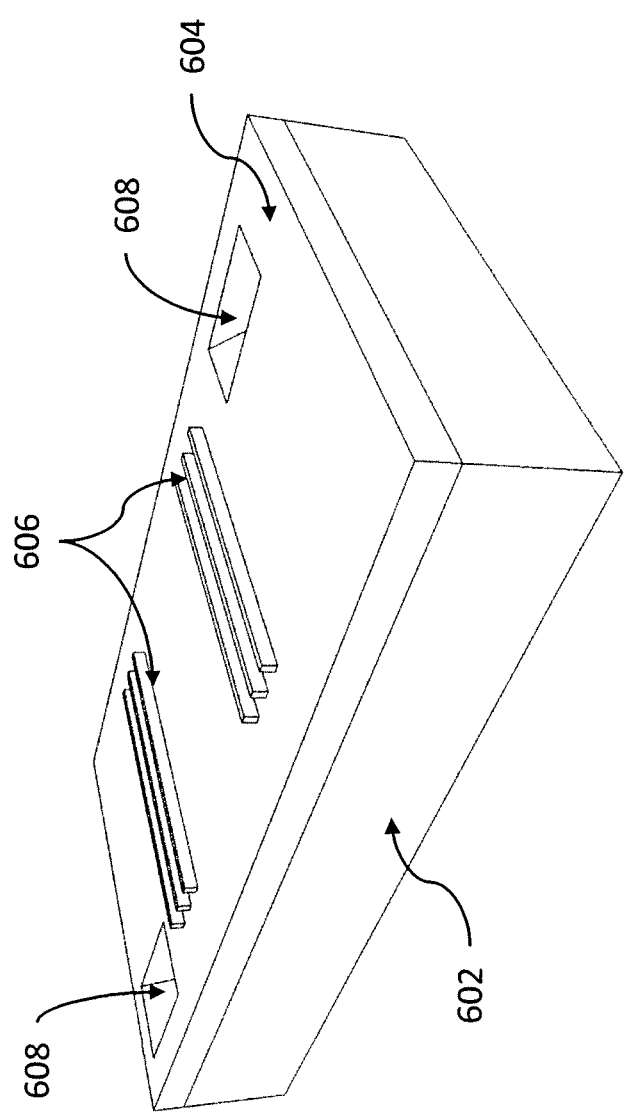

Referring now to FIGS. 6D and 7, in operation 710, anchor holes 608 are etched in sacrificial layer 604 as shown in FIG. 6D. In one embodiment, as shown in FIG. 6D, two anchor holes 608 are formed at opposite corner sides of sacrificial layer 604. In one embodiment, anchor holes 608 are formed with angled sides.

Figure 6E:
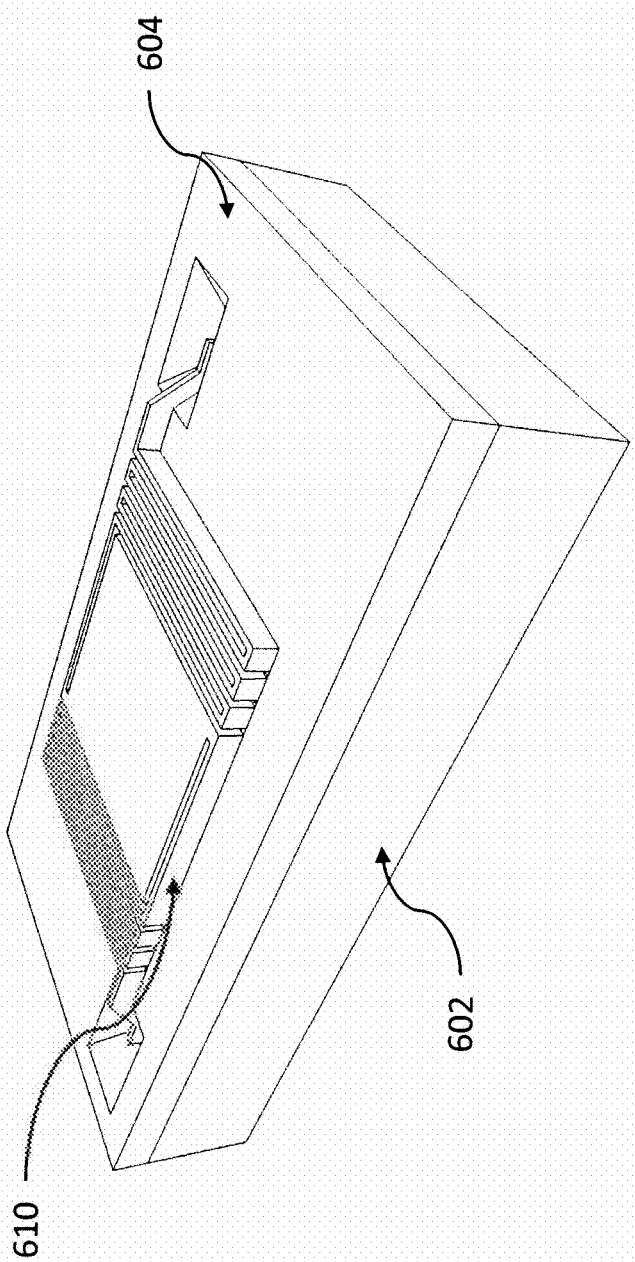

Referring now to FIGS. 6E and 7, in operation 712, a piezoelectric material layer (not shown) is deposited over the top surface of sacrificial layer 604. In one embodiment, the deposition is conformal. In one embodiment, the piezoelectric material is a material such as aluminum nitride (AlN) or silicon carbonate (SiC). As is well known to those of skill in the art, there are numerous methods for growing AlN and SiC on both silicon (Si) and silicon carbide (SiC). In the present embodiment, the growth of piezoelectric material layer is on the top surface of sacrificial layer 604. Those of skill in the art can recognize that the polytype of SiC grown is dependent on the material on which it is grown. For example, in order to grow SiC on a Si substrate (or layer), single crystal 3C—SiC is used due to the dissimilarity in crystalline structure of SiC (6H) with Si. In operation 714, following deposition of the piezoelectric material layer, piezoelectric material layer is etched to form piezoelectric material structure 610.

Figure 6F:
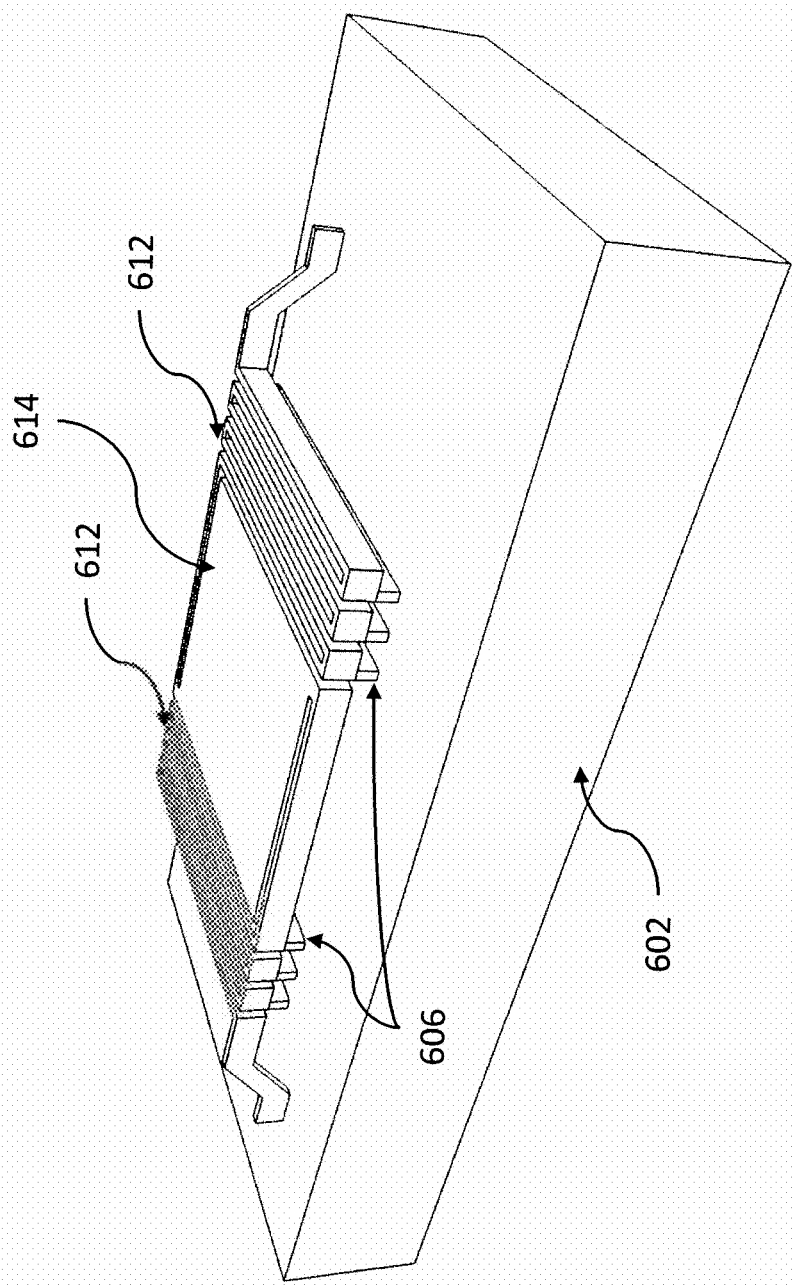

Referring now to FIGS. 6F and 7, in operation 716, sacrificial layer 604 is removed. As illustrated in FIG. 6F, removal of sacrificial layer 604 results in the creation of the freestanding bimaterial piezoelectric structure 614, elevated on top of substrate 602. As shown in FIG. 6F coating material 606 is now present on alternating legs of bimaterial multifold legs 612.

Figure 6G:
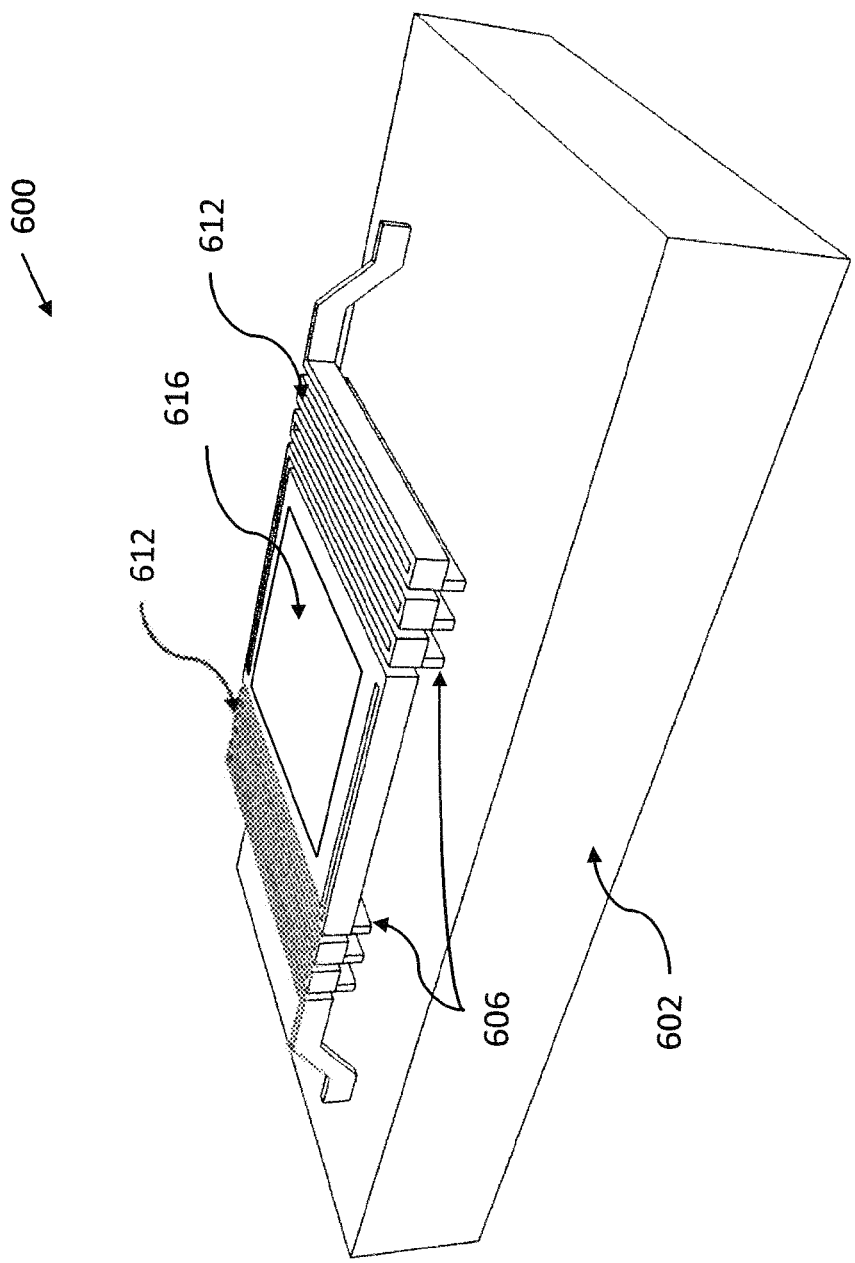

Referring now to FIGS. 6G and 7, in operation 718, a broad-band radiation absorptive material layer 616 is formed on the top surface of structure 614 as earlier described, such as by deposition and etching, selective deposition, growth, or other method of formation or application. The resultant bimaterial MEMS device, shown as 600 in FIG. 6G, is now complete and ready to be attached to electrical circuitry, such that when exposed to radiant energy, such as from the sun, electricity is generated as earlier described herein.

As can be understood by those of skill in the art, method 700 presents but one embodiment of a method of forming bimaterial MEMS solar power generator device 100, and that other fabrication processes and techniques can also be utilized.

In other embodiments, a plurality of bimaterial MEMS solar power generator devices 100 can be connected, such as in an array, to harness the radiant energy from the sun by absorbing radiation over a wide spectral range, and converting the resulting heat into electricity using the bimorph and piezoelectric effects. In this fashion, a large area can be utilized. The number of the bimaterial MEMS solar power generator devices 100 formed in the array as well as the nature of their connection (in series or in parallel) can be customized to support the energy needs of a particular load.

Accordingly, this disclosure provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

What is claimed is:

1. A bimaterial microelectromechanical system (MEMS) solar power generator device comprising:
   a heat sink structure; and
   a bimaterial piezoelectric structure supported on and above said heat sink structure at an offset distance;
   said bimaterial piezoelectric structure further comprising:
      a piezoelectric material;
      a broad-band radiation absorptive material overlying and in conductive contact with at least a portion of said piezoelectric material; and
      a coating material underlying and in conductive contact with at least a portion of said piezoelectric material;
      wherein said piezoelectric material and said coating material have different thermal expansion coefficients.

2. The device of claim 1 wherein when said bimaterial MEMS solar power generator device receives radiant energy it generates electricity through at least a piezoelectric effect.

3. The device of claim 2 further comprising:
   one or more electrical circuit connections in conductive contact with said bimaterial piezoelectric structure to allow said electricity to be transferred from said bimaterial MEMS solar power generator device.

4. The device of claim 1 wherein when said bimaterial MEMS solar power generator device receives radiant energy it generates electricity through a bimorph effect and a piezoelectric effect.

5. The device of claim 1 wherein when said bimaterial MEMS solar power generator device receives radiant energy at least a portion of said bimaterial piezoelectric structure deforms and generates electricity through at least a piezoelectric effect.

6. The device of claim 1 wherein said piezoelectric material is a material having piezoelectric properties.

7. The device of claim 1 wherein said piezoelectric material is a material having piezoelectric properties selected from the group consisting of quartz, aluminum nitride, and silicon carbide.

8. The device of claim 1 wherein said coating material is a metal.

9. The device of claim 8 wherein said metal is aluminum.

10. The device of claim 1 wherein said broad-band radiation absorptive material is a carbon nanostructure.

11. A bimaterial microelectromechanical system (MEMS) solar power generator device comprising:
a heat sink structure; and
a bimaterial piezoelectric structure in contact with and located above said heat sink structure;
said bimaterial piezoelectric structure further comprising:
a central body portion;
a plurality of bimaterial multifold legs connected to and extending from said central body portion; and
at least one support legs structures connected to and extending from said plurality of bimaterial multifold legs, said at least two attachment structures conductively connecting said bimaterial MEMS structure to said heat sink structure such that said central body portion is spaced an offset distance above said heat sink structure when not exposed to radiant energy;
wherein said bimaterial MEMS solar power generator device receives radiant solar energy and converts it through at least a piezoelectric effect into electricity.

12. A method for generating electricity by a bimaterial microelectromechanical system (MEMS) solar power generator device, the method comprising:
receiving radiant energy at a bimaterial piezoelectric structure;
converting at least a portion of said radiant energy to thermal energy by said bimaterial piezoelectric structure;
converting at least a portion of said thermal energy to electrical energy through the piezoelectric effect by said bimaterial piezoelectric structure; and
transferring at least a portion of said thermal energy to a heat sink structure underlying said bimaterial piezoelectric structure.

13. The method of claim 12 further comprising:
transferring at least a portion of said electrical energy from said bimaterial piezoelectric structure to an electrical circuit.

14. The method of claim 12 further comprising:
converting at least a portion of said thermal energy to mechanical energy also through a bimorph effect by said bimaterial piezoelectric structure.

15. The method of claim 12 wherein said receiving radiant energy at a bimaterial piezoelectric structure comprises:
receiving radiant energy at a broad-band radiation absorptive material.

16. The method of claim 15 wherein said converting at least a portion of said radiant energy to thermal energy by said bimaterial piezoelectric structure comprises:
converting at least a portion of said radiant energy to thermal energy by said broad-band absorptive material.

17. The method of claim 16 wherein said converting at least a portion of said thermal energy to electrical energy through the piezoelectric effect by said bimaterial piezoelectric structure comprises:
transferring at least a portion of said thermal energy from said broad-band radiation absorptive material to a piezoelectric material underlying said broad-band radiation absorptive material and to a coating material underlying at least a portion of said piezoelectric material, said piezoelectric material and said coating material having different thermal coefficients of expansion;
wherein in response to said transferring at least a portion of said thermal energy from said broad-band radiation absorptive material said piezoelectric material and said coating material deform and create electricity through a piezoelectric effect.

18. The method of claim 17 wherein said transferring at least a portion of said thermal energy to a heat sink structure underlying said bimaterial piezoelectric structure comprises:
transferring at least a portion of said thermal energy from at least said piezoelectric material to a heat sink structure at a maximum displacement position such that said piezoelectric material and said coating material un-deform.

* * * * *